United States Patent
Heertjes

(10) Patent No.: US 8,373,849 B2
(45) Date of Patent: Feb. 12, 2013

(54) LITHOGRAPHIC APPARATUS AND CONTROL SYSTEM

(75) Inventor: Marcel François Heertjes, Best (NL)

(73) Assignee: ASML Netherlands B.V., Veldhoven (NL)

( * ) Notice: Subject to any disclaimer, the term of this patent is extended or adjusted under 35 U.S.C. 154(b) by 628 days.

(21) Appl. No.: 12/580,328

(22) Filed: Oct. 16, 2009

(65) Prior Publication Data

US 2010/0123890 A1    May 20, 2010

Related U.S. Application Data

(60) Provisional application No. 61/114,670, filed on Nov. 14, 2008.

(51) Int. Cl.
*G03B 27/58* (2006.01)
*G03B 27/62* (2006.01)
*G03B 27/42* (2006.01)
*G03B 27/32* (2006.01)

(52) U.S. Cl. .................. 355/72; 355/53; 355/75; 355/77

(58) Field of Classification Search .................... 355/53, 355/72–77; 318/135, 560–561, 608–610, 318/619, 632, 633; 702/150; 250/492.1, 250/492.2, 492.22, 548; 700/121
See application file for complete search history.

(56) References Cited

U.S. PATENT DOCUMENTS

| | | | | |
|---|---|---|---|---|
| 4,030,132 A | * | 6/1977 | Iftikar et al. | 360/78.06 |
| 4,725,942 A | * | 2/1988 | Osuka | 700/30 |
| 5,184,055 A | * | 2/1993 | Ohishi et al. | 318/615 |
| 5,389,867 A | * | 2/1995 | Adachi et al. | 318/601 |
| 5,694,016 A | * | 12/1997 | Heinkel | 318/616 |
| 6,515,442 B1 | * | 2/2003 | Okubo et al. | 318/560 |
| 2002/0063539 A1 | * | 5/2002 | Tan et al. | 318/135 |
| 2002/0104950 A1 | * | 8/2002 | Mayama | 248/638 |
| 2003/0053035 A1 | * | 3/2003 | Butler et al. | 355/53 |
| 2006/0119829 A1 | * | 6/2006 | Cox et al. | 355/72 |
| 2007/0236163 A1 | * | 10/2007 | Heertjes et al. | 318/619 |

\* cited by examiner

*Primary Examiner* — Toan Ton
*Assistant Examiner* — Christina Riddle
(74) *Attorney, Agent, or Firm* — Pillsbury Winthrop Shaw Pittman LLP

(57) ABSTRACT

A control system to control a position quantity of a movable object in dependency of signals provided by a sensor representing an actual position quantity of the moveable object, the control system being configured to provide a drive signal to an actuator which is able to apply forces to the moveable object, the control system including a set-point generator to provide a reference signal; a subtractor to provide an error signal, the error signal being the difference between the reference signal and the signals provided by the sensor; a control unit to provide a drive signal to the actuator in dependency of the error signal, wherein the control unit comprises a nonlinear controller to improve a low-frequency disturbance suppression, and wherein the control unit further includes a compensator to at least partially compensate the deterioration of the high-frequency behavior caused by the nonlinear controller.

20 Claims, 3 Drawing Sheets

LITHOGRAPHIC APPARATUS AND CONTROL SYSTEM

CROSS REFERENCE TO RELATED APPLICATIONS

This application claims priority and benefit under 35 U.S.C. §119(e) to U.S. Provisional Patent Application No. 61/114,670, entitled "Lithographic Apparatus and Control System", filed on Nov. 14, 2008. The content of that application is incorporated herein in its entirety by reference.

FIELD

The present invention relates to a control system to control a position quantity of a moveable object. The present invention further relates to a lithographic apparatus including such a control system.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A lithographic apparatus generally includes moveable objects, such as for instance a support constructed to support the patterning device or a substrate table to hold the substrate. In these cases, positioning systems are provided to position the moveable objects with respect to another object, such as a frame, for instance a metrology frame or a base frame. Positioning systems generally include an actuator to apply a force to the moveable object in dependency of a drive signal provided by a control system.

The control system is configured to control a position quantity of the moveable object, such as a position, velocity, acceleration, jerk, etc., and can be an absolute or relative position quantity. In high-accuracy applications such as a lithographic apparatus, it is desirable that the positioning system provides closed-loop control and therefore includes a sensor to measure the actual position quantity of the moveable object, which is "fed back" into the control system as an input. Open-loop control without the use of a sensor may suffice if the required accuracy is relatively low.

Generally, a control system includes a set-point generator to provide a reference signal that represents a desired position quantity of the moveable object. The control system further includes a subtractor to compare the actual position quantity with the desired position quantity. The difference between the signals representing the actual and desired position quantity, i.e. the reference sensor and the signals provided by the sensor, is supplied to a control unit, which drives the actuator based on the difference (also known as error signal). The control unit usually includes a feedback controller and may include a feed-forward controller that provides an additional drive signal in dependency of a reference signal only.

The aim when designing a control system is to improve the low-frequency disturbance suppression while maintaining favorable high-frequency noise properties. However, bound by inherent design limitations a linear feedback control system generally fails in satisfying this aim to the fullest, especially when the behavior of the combination of actuator and moveable object is varying with the position. In that case, it may be difficult to optimize the control system over the entire positioning range. The varying behavior can be due to motor position dependent actuator properties (e.g. a motor position dependent motor constant), or when properties of parts of the moveable object are position dependent (e.g. a spring constant that is position dependent). To exceed beyond the possibilities given by a nominal (and linear) control system, nonlinear control can be used.

An example of nonlinear control is a variable gain control, wherein the gain of the control system is not constant for a given frequency, but depending on, for instance, the difference between the actual and desired position quantity of the moveable object. This increases the flexibility in dealing with position-dependent disturbances and thereby improves the low-frequency disturbance suppression. However, a drawback of this approach is that at the same time the high-frequency noise properties may deteriorate. This reduces the obtainable position accuracy of the positioning system and may result in imaging problems and/or overlay errors in the lithographic apparatus.

SUMMARY

It is desirable to provide a lithographic apparatus with reduced imaging problems and/or overlay errors. It is further desirable to improve the performance of a control system used to position a moveable object.

According to an embodiment of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate, and a positioning system to position a movable object, the positioning system including: an actuator to apply a force to the moveable object; a sensor to measure a position quantity of the moveable object; and a control system to provide a drive signal to the actuator, the control system including a set-point generator to provide a reference signal, a subtractor to provide an error signal, the error signal being the difference between the reference signal and a signal provided by the sensor; a control unit to provide a drive signal to the actuator in dependency of the error signal, wherein the control unit includes a nonlinear controller to improve a low-frequency disturbance suppression, and wherein the control unit further includes a compensator to at least partially compensate the deterioration of the high-frequency behavior of the control system introduced by the nonlinear controller.

According to another embodiment of the invention, there is provided a control system to control a position quantity of a movable object in dependency of a signal provided by a sensor representing an actual position quantity of the moveable object, the control system being configured to provide a drive signal to an actuator which is able to apply a force to the moveable object, the control system including: a set-point generator to provide a reference signal; a subtractor to provide an error signal, the error signal being the difference between the reference signal and the signal provided by the sensor; a control unit to provide a drive signal to the actuator in dependency of the error signal, wherein the control unit includes a nonlinear controller to improve a low-frequency disturbance suppression, and wherein the control unit further includes a compensator to at least partially compensate the deterioration of the high-frequency behavior of the control system introduced by the nonlinear controller.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
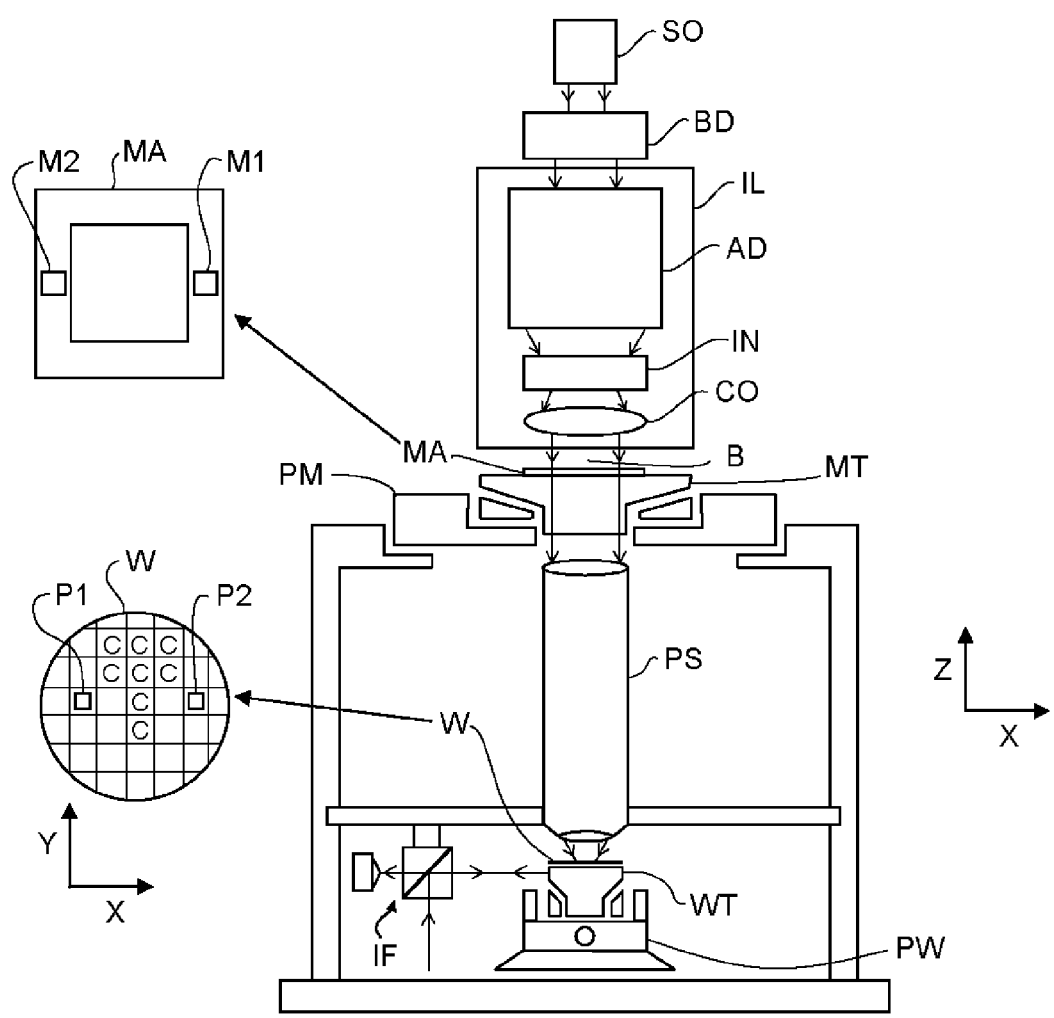
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases, the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g. mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the patterning device support (e.g. mask table) MT and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
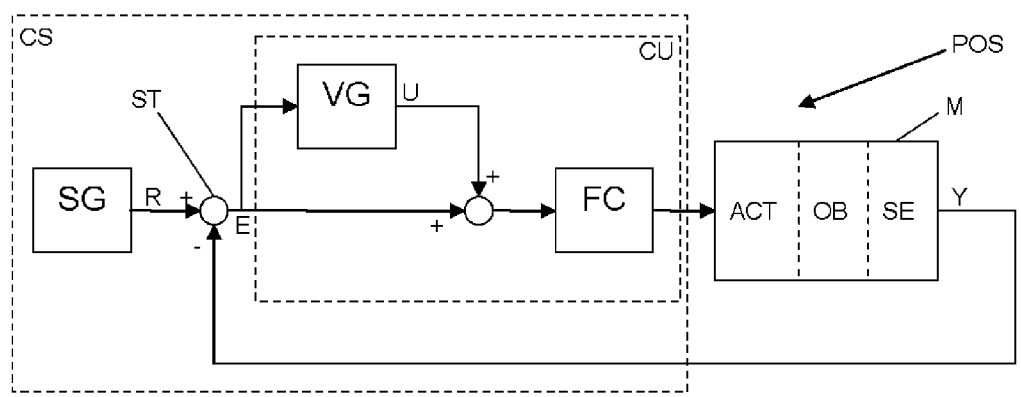
FIG. 2 depicts a block scheme of a prior art positioning system.

FIG. 2 depicts a block scheme of a prior art positioning system POS. The block scheme includes a model M. This model M includes a dynamic behavior of an actuator ACT and a moveable object OB, which may be part of a lithographic apparatus, for instance the lithographic apparatus according to FIG. 1. The input of the model M is a drive signal to the actuator ACT. The positioning system POS further includes a sensor SE to measure a position quantity Y of the object. The sensor SE is incorporated in the model M. The output of the model M is not the actual sensor output, which is usually a voltage, but is in this case the actual position quantity Y of the object. A skilled person familiar with block schemes will appreciate that a block scheme is a simplified representation of the real system and that signals present in the block scheme in reality may be available in another form and/or are represented by other signals. Block schemes are widely recognized as a way to explain working principles of, in this case, positioning systems.

The positioning system POS includes a control system CS that provides a drive signal to the actuator ACT of model M in dependency of the signals provided by the sensor SE. The control system CS includes a set-point generator SG to provide a reference signal R representing the desired position quantity of the object OB and a subtractor ST that provides an error signal E by subtracting the actual position quantity Y of the object OB from the reference signal R. Usually, the reference signal R is a voltage signal, but in this block scheme, reference signal R corresponds to the desired position quantity.

The error signal E is supplied to a control unit CU, which provides a drive signal to the actuator ACT in dependency of the error signal E. This is represented by connecting the output of the control unit CU to the model M.

The control unit CU includes a feedback controller FC. The error signal E is supplied to the input of the feedback controller FC. A skilled person will recognize that the direct connection between the subtractor ST and the feedback controller FC results in a nominal linear control system, wherein the feedback controller FC is a constant controller located in a feedback loop. However, the dynamic behavior of the model M may be position dependent, for instance in case of a motor position dependent motor constant or spring and/or damper properties that are dependent on the position quantity. For high-accuracy control systems, the constant feedback controller is not sufficient for optimized control within the positioning range. In fact, it may be desired that the control system is optimized for every position within the positioning range, resulting in a varying control system that can not be obtained with a constant control system.

One way of exceeding the possibilities of nominal linear control is to use nonlinear control such as variable gain control. In this way, the gain of the control unit CU is not constant for a given frequency, but varies based on the requirements of the positioning system POS. The behavior of the control system CS is then no longer linear, but becomes nonlinear.

In the prior art positioning system POS of FIG. 2, the control unit CU includes a nonlinear controller VG to apply variable gain control. The error signal E is supplied to the input of the nonlinear controller VG and an output U of the nonlinear controller is added to the error signal E and thereby supplied to the input of the (linear) feedback controller.

The nonlinear controller VG has the characteristic that the gain of the nonlinear controller VG depends on the input signal, i.e. the error signal E. Examples of possible characteristics are given in the following three equations (1), (2), and (3), wherein $G_{VG}$ represents the gain of the nonlinear controller VG, α represents a constant gain value, |E| represents the amplitude of the error signal E, and δ represents a dead-zone, wherein the gain of the nonlinear controller VG is zero.

$$G_{VG} = \alpha |E| \quad (1)$$

$$G_{VG} = \begin{cases} 0, & \text{if } |E| \leq \delta \\ \alpha, & \text{if } |E| > \delta \end{cases} \quad (2)$$

$$G_{VG} = \begin{cases} 0, & \text{if } |E| \leq \delta \\ \alpha - \frac{\alpha \delta}{|E|}, & \text{if } |E| > \delta \end{cases} \quad (3)$$

The characteristic of the nonlinear controller gain $G_{VG}$ according to equation (3) is preferred, since this characteristic has a smooth transition between the gain in the dead-zone and the gain outside the dead-zone. It is remarked here that other characteristics are possible as well.

The output U of the nonlinear controller VG is defined as: $U=G_{VG} \cdot E$. Because of the behavior of the nonlinear controller VG (see equations (1), (2), or (3)), the nonlinear controller VG adds extra gain to the control unit depending on the amplitude of the error signal E, thereby changing the behavior of the control system CS.

The effect of the addition of the nonlinear controller VG on the performance of the control system can be seen in low-frequency limit of the sensitivity function of the positioning system including the model M. The low-frequency limit of the sensitivity function (4) between the error signal E and the reference signal R describes the ability to keep the low-frequency error signal E small in view of input disturbances. The gain of the nonlinear controller VG is assumed to be a constant gain α in this particular equation (4):

$$\lim_{s \to 0} \left\{ \frac{E(s)}{R(s)} \right\} = \frac{1}{(1+\alpha)FC(s)M(s)} \quad (4)$$

From equation (4) it can be derived that the nonlinear controller VG gives a factor (1+α) extra low-frequency disturbance rejection when compared to the case that $G_{VG}=0$, hence in absence of the nonlinear controller VG. This low-frequency improvement, however, comes at the cost of an increased sensitivity to high-frequency noise. This can be seen in the high-frequency limit of the complementary sensitivity function (5) between Y and R, which expresses the ability to limit the high-frequency output in view of output noises. The gain of the nonlinear controller VG is assumed to be a constant gain α in this particular equation (5):

$$\lim_{s \to \infty} \left\{ \frac{Y(s)}{R(s)} \right\} = (1+\alpha)FC(s)M(s) \quad (5)$$

So, increased low-frequency disturbance rejection by a factor of (1+α) leads to an increased high-frequency noise sensitivity with the same amount.

Figure 3:
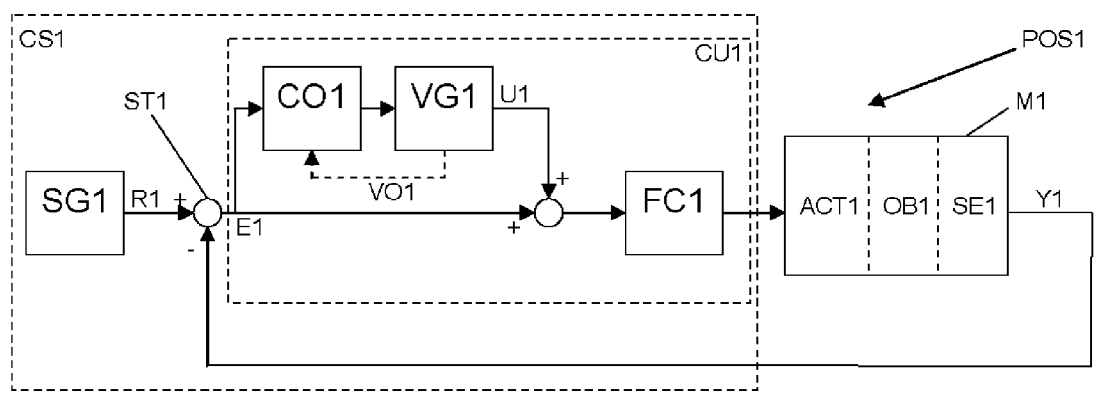
FIG. 3 depicts a block scheme of a positioning system including a control system according to an embodiment of the invention.

FIG. 3 depicts a block scheme of a positioning system POS1 according to an embodiment of the invention. The block scheme includes a model M1, which represents a dynamic behavior of a moveable object OB1, an actuator ACT1 that is able to apply forces to the object OB1, and a sensor SE1 that measures an actual position quantity Y1 of the object OB1. The input of the model M1 is the drive signal to the actuator ACT1, and the output of the model M1 is the actual position quantity Y1 of the object OB1, similar to the model M of the prior art positioning system POS of FIG. 2.

The positioning system POS1 further includes a control system CS1 including a signal generator SG1, a subtractor ST1, and a control unit CU1. The signal generator SG1 provides a reference signal R1 representing the desired position quantity of the moveable object OB1. Normally, reference signal R1 is a voltage signal, but in this block scheme it corresponds to the desired position quantity. The subtractor ST1 provides an error signal E1, which is defined as the difference between the reference signal R1 and the output Y1 of the model M1.

The error signal E1 is supplied to the input of the control unit CU1, which provides a drive signal to the actuator ACT1 of model M1. The control unit CU1 includes a feedback controller FC1, which can be a linear controller. The error signal E1 is supplied together with an output U1 of a nonlinear controller VG1 to the input of the feedback controller FC1.

The nonlinear controller VG1 is configured to improve a low-frequency disturbance suppression similar to the nonlinear controller VG of FIG. 2. The nonlinear controller VG1 may, due to its characteristics, negatively influence the high-frequency behavior of the control system CS1. The control unit CU1 therefore includes a compensator CO1 to at least partially compensate the deterioration of the high-frequency behavior introduced by the nonlinear controller VG1. Due to the compensator CO1, the low-frequency disturbance rejection is improved while maintaining favorable high-frequency noise properties. The accuracy of the positioning system POS1 is therefore increased, resulting in minimal imaging problems and overlay errors if the positioning system POS1 is used in a lithographic apparatus, for example the lithographic apparatus of FIG. 1.

In the embodiment of FIG. 3, the compensator CO1 is located in series with, and in front of the nonlinear controller VG1. However, the location of the compensator CO1 is not limited to this site. Parallel to the nonlinear controller VG1, behind the nonlinear controller VG1, and even just in front of the feedback controller are also envisaged as location for the compensator CO1. However, in series with the nonlinear controller VG1 and not in the nominal linear feedback loop is preferred, because this allows a simpler design of both the compensator CO1 and the nonlinear controller VG1 independent of the nominal linear feedback loop parallel to the nonlinear controller VG1.

The compensator CO1 may be dependent on a signal VO1 of the nonlinear controller VG1 as indicated by the dashed line between the compensator CO1 and the nonlinear controller VG1, but this is not necessary, because the characteristics of the nonlinear controller are known. This information may be incorporated into the compensator CO1, which is, based on this information and the error signal E1, able to at least partially compensate the high-frequency deterioration of the behavior of the control system introduced by the nonlinear controller VG1.

In this embodiment, the aim of the compensator CO1 is to adjust its high-frequency gain without adjusting its low-frequency gain if the nonlinear controller VG1 has a non-zero output U1, thereby allowing a full low-frequency performance improvement and compensation of the associated deterioration at high frequencies. In case the nonlinear controller adds extra gain to the control system as explained for the nonlinear controller VG of FIG. 2, the compensator CO1 will decrease its gain for high frequency with an appropriate value to at least partially compensate the extra introduced gain for high frequencies. This decrease in gain can be accomplished when the compensator CO1 has low-pass characteristics, wherein a cut-off frequency is adjusted. Lowering the cut-off frequency will decrease the gain for frequencies above the cut-off frequency, and vice versa.

In an embodiment, the compensator CO1 includes an observer. The observer has low-pass characteristics, thereby allowing a gain change for high frequencies without significantly altering the low-frequency gain. If the output (having the characteristic of an estimated error signal) of the observer is supplied to the nonlinear controller VG1, the additional benefit is that the estimated error signal is filtered for high frequency noise, thereby improving the performance of the nonlinear controller VG1 with respect to prior art systems, wherein an unfiltered error signal including high frequency noise is supplied to a nonlinear controller. As an alternative, the observer may be replaced by a low-pass filter.

The nonlinear controller VG1 may include a loop-shaping filter (not shown), preferably in series with the aforementioned characteristics of the nonlinear controller, to further enhance the performance of the control system. This can be done by for instance reducing an amplitude of a resonance using a notch filter, and/or changing the amplitude and/or phase in a frequency range, thereby increasing a bandwidth of the closed-loop system. The aim of the loop-shaping filter may also be to guarantee stability of the closed loop system.

Figure 4:
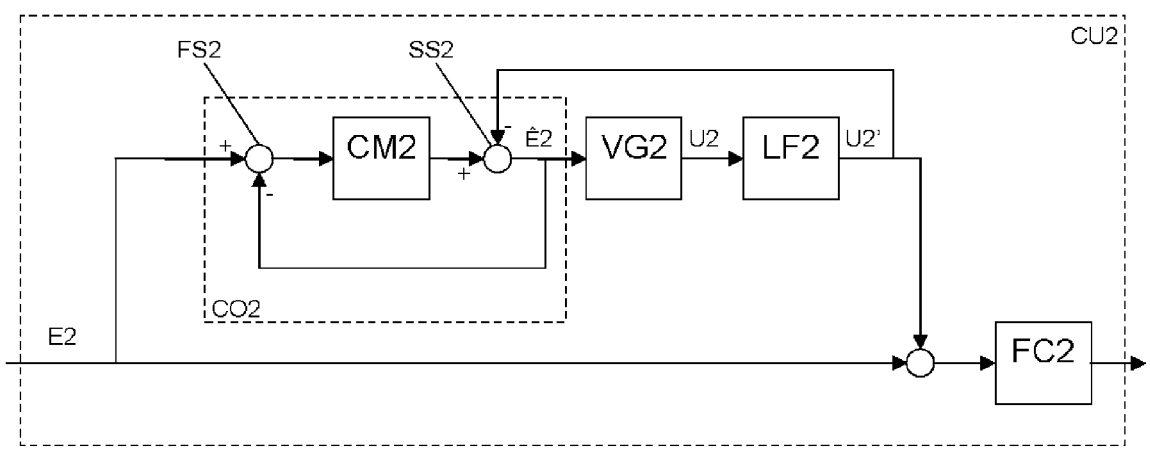
FIG. 4 depicts a block scheme of a part of a control system according to another embodiment of the invention.

FIG. 4 depicts a control unit CU2 which can be used in a control system according to another embodiment of the invention. FIG. 4 in particular depicts a control unit CU2 that can be used between an error signal E2 and a drive signal of an actuator similar to the embodiments of FIGS. 2 and 3. The control unit CU2 includes in series a first subtractor FS2, a compensation unit CM2, a second subtractor SS2, a nonlinear controller VG2, and a loop-shaping filter LF2. The first subtractor FS2, the compensation unit CM2, and the second subtractor SS2 form part of a compensator CO2. Parallel to this series connection runs the plain error signal E2, which is combined with an output U2' of the loop shape filter LF2 to form an input to a feedback controller FC2.

The nonlinear controller VG2 is configured to improve the low-frequency disturbance suppression if necessary and adds extra gain to the control unit it forms part of The characteristics of the nonlinear controller VG2 may be similar to the characteristics of the nonlinear controller VG in FIG. 2 (see equations (1), (2), and (3)). An output U2 of the nonlinear controller VG2 is supplied to the loop-shaping filter LF2.

The loop-shaping filter LF2 is configured to enhance the performance of the control system. This can be done by for instance reducing an amplitude of a resonance using a notch filter, and/or changing the amplitude and/or phase in a frequency range, thereby increasing a bandwidth of the closed loop system. The aim of the loop-shaping filter may also be to guarantee stability of the closed loop system. However, in this embodiment, the gain of the loop-shaping filter LF2 is considered to be unity for most frequencies for simplicity reasons.

The second subtractor SS2 is configured to subtract the output U2' of the loop-shaping filter from the output of the compensation unit CM2. The output $\hat{E}2$ of the second subtractor SS2 is supplied as input to the nonlinear controller VG2.

The first subtractor FS2 is configured to subtract the output $\hat{E}2$ of the second subtractor SS2 from the error signal E2. The output of the first subtractor FS2 is supplied as input to the compensation unit CM2.

The compensation unit CM2 preferably has a low-pass characteristic. This can be obtained if the compensation unit CM2 is an observer or a low-pass filter. Observers and low-pass filters are known in the art. The low-pass characteristic of the compensation unit CM2 has the additional benefit that the input of the nonlinear controller VG2 is filtered for high-frequency noise.

Because the output U2 of the nonlinear controller VG2 is fed back indirectly via output U2' into the compensator CO2, the compensator characteristics are adapted to the output U2 of the nonlinear controller VG2. In other words: the output U2' is used in the observed error $\hat{E}2$. The equation (6) describing the relation between the observed error $\hat{E}2$ and the error signal E2 for this embodiment (in Laplace form), wherein $G_{VG2}$ for this equation is assumed to be a constant gain $\alpha$ of the nonlinear controller VG2, is:

$$\frac{\hat{E}2(s)}{E2(s)} = \frac{CM2(s)}{1 + CM2(s) + \alpha \cdot LF2(s)} \quad (6)$$

From equation (6) it can be seen that if $G_{VG2} \neq 0$, the gain of the observer is decreased. Especially when the compensation unit CM2 has low-pass characteristics and the loop-shaping filter LF2 has not (and is for instance unity), equation (6) can be approximated for high frequencies by:

$$\frac{\hat{E}2(s)}{E2(s)} = \frac{CM2(s)}{1 + \alpha} \quad (7)$$

As can be seen from equation (7), the gain of the observer is decreased for high frequencies with the same factor $(1+\alpha)$ with which the nonlinear controller tends to deteriorate the system. The actual observer behavior depends on the choice for the compensation unit CM2 and the loop-shaping filter LF2. Normally, the loop-shaping filter LF2 is mainly designed in the context of closed-loop stability, whereas compensation unit CM2 and the nonlinear controller VG2 are designed in view of closed-loop performance. The compensation of the high-frequency behavior can also be done for a specific frequency range. For instance, in discrete systems only compensation below the Nyquist frequency may be necessary.

In general, the result of the combination of a nonlinear controller with a compensator results in a control system that has an improved low-frequency disturbance suppression, and that can adapt itself to the situation in which a moveable object is, and is able to maintain favorable high-frequency noise properties. The nonlinear controller and the compensator can be used in discrete and continuous systems or a mix thereof The location of the compensator and nonlinear controller is not limited to the locations shown in the FIGS. 2-4.

In an embodiment a lithographic apparatus is provided including an illumination system configured to condition a radiation beam and a support constructed to support a patterning device. The patterning device is capable of imparting the radiation beam with a pattern in its cross-section to form a patterned radiation beam. The lithographic apparatus further includes a projection system and a substrate table constructed to hold a substrate. The projection system is configured to project the patterned radiation beam onto a target portion of the substrate. The lithographic apparatus further includes a positioning system to position a movable object. The positioning system includes an actuator, a sensor and a control system. The actuator is configured to apply forces to the moveable object. The sensor is configured to measure a position quantity of the moveable object. The control system is configured to provide a drive signal to the actuator and includes a set-point generator, a subtractor and a control unit. The set-point generator is configured to provide a reference signal. The subtractor is configured to provide an error signal which is the difference between the reference sensor and a signal provided by the sensor. The control unit is configured to provide a drive signal to the actuator in dependency of the error signal. The control unit includes a nonlinear controller to improve a low-frequency disturbance suppression, and further includes a compensator to at least partially compensate the deterioration of the high-frequency behavior caused by the nonlinear controller.

The compensator and the nonlinear controller may be arranged in series, wherein the compensator is configured to adjust its gain in dependency of the output of the nonlinear controller.

The compensator may have low-pass characteristics of which the cut-off frequency is adjusted in dependency of the output of the nonlinear controller. The compensator may include a first subtractor, a second subtractor and a compensation unit having low-pass characteristics. The first subtractor may be configured to subtract the output of the nonlinear controller from the output of the compensation unit. The second subtractor may be configured to subtract the output of the first subtractor from the error signal. The output of the first subtractor maybe supplied as input to the nonlinear controller. The output of the second subtractor may be supplied as input to the compensation unit.

The compensation unit may be an observer. The compensation unit may be a low-pass filter. The nonlinear controller may include a loop-shaping filter.

The compensator and the nonlinear controller may be arranged in series with a feedback controller which provides a drive signal to the actuator in dependency of the output of the nonlinear controller and the error signal. The compensator and the nonlinear controller may be arranged parallel to a feed-forward controller, which provides a drive signal to the actuator in dependency of the reference signal. The moveable object may be the support or the substrate table.

In an embodiment there is provided a control system to control a position quantity of a movable object in dependency of signals provided by a sensor representing an actual position quantity of the moveable object. The control system is configured to provide a drive signal to an actuator which is able to apply forces to the moveable object. The control system includes a set-point generator, a subtractor and a control unit. The set-point generator is configured to provide a reference signal. The subtractor is configured to provide an error signal, the error signal being the difference between the reference sensor and the signals provided by the sensor. The control unit is configured to provide a drive signal to the actuator in dependency of the error signal and includes a nonlinear controller to improve a low-frequency disturbance suppression. The control unit further includes a compensator to at least partially compensate the deterioration of the high-frequency behavior caused by the nonlinear controller.

The compensator and the nonlinear controller may be arranged in series. The compensator may be configured to adjust its gain in dependency of the output of the nonlinear controller. The compensator may have low-pass characteristics of which the cut-off frequency is adjusted in dependency of the output of the nonlinear controller.

The compensator may include a first subtractor, a second subtractor and a compensation unit having low-pass characteristics. The first subtractor may be configured to subtract the output of the nonlinear controller from the output of the compensation unit, and the second subtractor may be configured to subtract the output of the first subtractor from the error signal. The output of the first subtractor may be supplied as input to the nonlinear controller. The output of the second subtractor may be supplied as input to the compensation unit.

The compensation unit may be an observer. The compensation unit may be a low-pass filter. The nonlinear controller may include a loop-shaping filter.

The compensator and the nonlinear controller may be arranged in series with a feedback controller which provides a drive signal to the actuator in dependency of the output of the nonlinear controller and the error signal. The compensator and the nonlinear controller may be arranged parallel to a feed-forward controller, which provides a drive signal to the actuator in dependency of the reference signal. The moveable object may be a support or a substrate table of a lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
    a support constructed to support a patterning device, the patterning device being capable of imparting a radiation beam with a pattern in its cross-section to form a patterned radiation beam;
    a substrate table constructed to hold a substrate;
    a projection system configured to project the patterned radiation beam onto a target portion of the substrate; and
    a positioning system configured to position a movable object, the positioning system comprising
        an actuator configured to apply a force to the moveable object;
        a sensor configured to measure a position quantity of the moveable object; and
        a control system configured to provide a drive signal to the actuator, the control system comprising
            a set-point generator configured to provide a reference signal;
            a subtractor configured to provide an error signal, the error signal being a difference between the reference signal and a signal provided by the sensor; and
            a control unit configured to provide the drive signal to the actuator in dependency of the error signal,
            wherein the control unit comprises a nonlinear controller configured to improve a low-frequency disturbance suppression and a compensator configured to at least partially compensate a deterioration of a high-frequency behavior of the control system caused by the nonlinear controller, wherein the nonlinear controller is configured to improve the low-frequency disturbance suppression based on an output of the compensator.

2. The lithographic apparatus of claim 1, wherein the compensator and the nonlinear controller are arranged in series, and wherein the compensator is configured to adjust its gain in dependency of an output of the nonlinear controller.

3. The lithographic apparatus of claim 1, wherein the compensator has low-pass characteristics of which a cut-off frequency is adjusted in dependency of an output of the nonlinear controller.

4. A lithographic apparatus comprising:
    a support constructed to support a patterning device, the patterning device being capable of imparting a radiation beam with a pattern in its cross-section to form a patterned radiation beam;
    a substrate table constructed to hold a substrate;
    a projection system configured to project the patterned radiation beam onto a target portion of the substrate; and
    a positioning system configured to position a movable object, the positioning system comprising
        an actuator configured to apply a force to the moveable object;
        a sensor configured to measure a position quantity of the moveable object; and
        a control system configured to provide a drive signal to the actuator, the control system comprising
            a set-point generator configured to provide a reference signal;
            a subtractor configured to provide an error signal, the error signal being a difference between the reference signal and a signal provided by the sensor; and
            a control unit configured to provide the drive signal to the actuator in dependency of the error signal,
            wherein the control unit comprises a nonlinear controller configured to improve a low-frequency disturbance suppression and a compensator configured to at least partially compensate a deterioration of a high-frequency behavior of the control system caused by the nonlinear controller,
            wherein the compensator comprises a compensation unit having low-pass characteristics, a first subtractor, and a second subtractor, the first subtractor being configured to subtract an output of the nonlinear controller from an output of the compensation unit, and the second subtractor being configured to subtract an output of the first subtractor from the error signal, wherein the output of the first subtractor is supplied as input to the nonlinear controller, and wherein the output of the second subtractor is supplied as input to the compensation unit.

5. The lithographic apparatus of claim 4, wherein the compensation unit is an observer.

6. The lithographic apparatus of claim 4, wherein the compensation unit is a low-pass filter.

7. The lithographic apparatus of claim 1, wherein the nonlinear controller comprises a loop-shaping filter.

8. The lithographic apparatus of claim 1, wherein the compensator and the nonlinear controller are arranged in series with a feedback controller configured to provide a drive signal to the actuator in dependency of an output of the nonlinear controller and the error signal.

9. The lithographic apparatus of claim 1, wherein the compensator and the nonlinear controller are arranged parallel to a feed-forward controller configured to provide a drive signal to the actuator in dependency of the reference signal.

10. A control system configured to control a position quantity of a movable object in dependency of a signal provided by a sensor representing an actual position quantity of the moveable object, the control system being configured to provide a drive signal to an actuator configured to apply a force to the moveable object, the control system comprising:

a set-point generator configured to provide a reference signal;

a subtractor configured to provide an error signal, the error signal being a difference between the reference signal and the signal provided by the sensor; and a control unit configured to provide the drive signal to the actuator in dependency of the error signal, the control unit comprising a nonlinear controller configured to improve a low-frequency disturbance suppression and a compensator configured to at least partially compensate a deterioration of a high-frequency behavior of the control system caused by the nonlinear controller, wherein the nonlinear controller is configured to improve the low-frequency disturbance suppression based on an output of the compensator.

11. The control system of claim 10, wherein the compensator and the nonlinear controller are arranged in series, and wherein the compensator is configured to adjust its gain in dependency of an output of the nonlinear controller.

12. The control system of claim 10, wherein the compensator has low-pass characteristics of which a cut-off frequency is adjusted in dependency of an output of the nonlinear controller.

13. A control system configured to control a position quantity of a movable object in dependency of a signal provided by a sensor representing an actual position quantity of the moveable object, the control system being configured to provide a drive signal to an actuator configured to apply a force to the moveable object, the control system comprising:, a set-point generator configured to provide a reference signal;

a subtractor configured to provide an error signal, the error signal being a difference between the reference signal and the signal provided by the sensor; and a control unit configured to provide the drive signal to the actuator in dependency of the error signal, the control unit comprising a nonlinear controller configured to improve a low-frequency disturbance suppression and a compensator configured to at least partially compensate a deterioration of a high-frequency behavior of the control system caused by the nonlinear controller, wherein the compensator comprises a compensation unit having low-pass characteristics, a first subtractor, and a second subtractor, the first subtractor being configured to subtract an output of the nonlinear controller from an output of the compensation unit, and the second subtractor being configured to subtract an output of the first subtractor from the error signal, wherein the output of the first subtractor is supplied as input to the nonlinear controller, and wherein an output of the second subtractor is supplied as input to the compensation unit.

14. The control system of claim 13, wherein the compensation unit is an observer.

15. The control system of claim 13, wherein the compensation unit is a low-pass filter.

16. The control system of claim 10, wherein the nonlinear controller comprises a loop-shaping filter.

17. The control system of claim 10, wherein the compensator and the nonlinear controller are arranged in series with a feedback controller configured to provide a drive signal to the actuator in dependency of an output of the nonlinear controller and the error signal.

18. The control system of claim 10, wherein the compensator and the nonlinear controller are arranged parallel to a feed-forward controller configured to provide a drive signal to the actuator in dependency of the reference signal.

19. The control system of claim 10, wherein the moveable object is a support or a substrate table of a lithographic apparatus.

20. The control system of claim 10, wherein the position quantity is a position, or a velocity, or an acceleration or a jerk.

* * * * *